(12) United States Patent
Jian et al.

(10) Patent No.: US 9,484,887 B2
(45) Date of Patent: Nov. 1, 2016

(54) ACOUSTIC WAVE BAND REJECT FILTER

(71) Applicant: Telefonaktiebolaget L M Ericsson (publ), Stockholm (SE)

(72) Inventors: Chunyun Jian, Ottawa (CA); Somsack Sychaleun, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 767 days.

(21) Appl. No.: 13/726,668

(22) Filed: Dec. 26, 2012

(65) Prior Publication Data

US 2014/0145799 A1    May 29, 2014

Related U.S. Application Data

(60) Provisional application No. 61/730,656, filed on Nov. 28, 2012.

(51) Int. Cl.
*H03H 9/64* (2006.01)
*H03H 9/54* (2006.01)
(Continued)

(52) U.S. Cl.
CPC .............. *H03H 9/6409* (2013.01); *H03H 3/02* (2013.01); *H03H 3/08* (2013.01); *H03H 9/059* (2013.01); *H03H 9/0514* (2013.01); *H03H 9/0542* (2013.01); *H03H 9/08* (2013.01); *H03H 9/542* (2013.01); *H03H 9/547* (2013.01);
(Continued)

(58) Field of Classification Search
CPC ........ H03H 9/46; H03H 9/542; H03H 9/547; H03H 9/606; H03H 9/64; H03H 9/6409; H03H 9/6483; H03H 9/6426; H03H 9/08; H03H 9/605; H03H 2009/0019; H03H 9/0514; H03H 9/059; H03H 3/02; H03H 3/08; Y10T 29/42
USPC .......................... 333/133, 186, 187, 193–195
See application file for complete search history.

(56) References Cited

U.S. PATENT DOCUMENTS 4,910,481 A    3/1990 Sasaki et al.
6,489,862 B1 * 12/2002 Frank ........................ H03F 1/26
                                                                330/302

(Continued)

FOREIGN PATENT DOCUMENTS

EP    0 422 637 A2    4/1991
EP    1 398 876 A1    3/2004

OTHER PUBLICATIONS

Mourot_etal_Stopband Filters Built in the BAW Technology, Published Oct. 2008, IEEE Microwave Magazine pp. 104-116, date of current version Sep. 9, 2008, consisting of 7-pages.

(Continued)

*Primary Examiner* — Barbara Summons
*Assistant Examiner* — Jorge Salazar, Jr.
(74) *Attorney, Agent, or Firm* — Christopher & Weisberg, P.A.

(57) ABSTRACT

A method and system for an acoustic wave band reject filter are disclosed. According to one aspect, an acoustic wave band reject filter includes a substrate and a plurality of acoustic wave band reject filter blocks. The substrate includes bonding pads formed on the substrate. Each one of the plurality of acoustic wave band reject filter blocks is fixed on a separate die. Each separate die has solder balls on a side of the die facing the substrate. The solder balls are positioned to electrically connect the bonding pads formed on the substrate to positions on each of the die.

17 Claims, 8 Drawing Sheets

(51) Int. Cl.
  H03H 9/08   (2006.01)
  H03H 9/05   (2006.01)
  H03H 3/02   (2006.01)
  H03H 3/08   (2006.01)
  H03H 9/60   (2006.01)
  H03H 9/00   (2006.01)

(52) U.S. Cl.
  CPC .......... H03H 9/605 (2013.01); H03H 9/6423 (2013.01); H03H 9/6426 (2013.01); H03H 9/6483 (2013.01); *H03H 2009/0019* (2013.01); *Y10T 29/42* (2015.01)

(56) References Cited

U.S. PATENT DOCUMENTS

| | | |
|---|---|---|
| 6,710,677 B2 | 3/2004 | Beaudin et al. |
| 6,924,715 B2 | 8/2005 | Beaudin et al. |
| 7,777,597 B2 | 8/2010 | Beaudin et al. |
| 7,821,358 B2 | 10/2010 | Block et al. |
| 8,018,304 B2 | 9/2011 | Jian |
| 8,060,156 B2 | 11/2011 | Gagnon et al. |
| 8,204,031 B2 | 6/2012 | Jian et al. |
| 2002/0109563 A1* | 8/2002 | Bradley et al. .............. 333/187 |
| 2007/0111335 A1 | 5/2007 | Miyazawa et al. |
| 2008/0068109 A1* | 3/2008 | Schmidhammer ........... 333/133 |
| 2010/0265010 A1* | 10/2010 | Jian .............................. 333/189 |
| 2011/0235557 A1 | 9/2011 | Jian |
| 2013/0271242 A1 | 10/2013 | Bauer et al. |

OTHER PUBLICATIONS

Invitation to Pay Additional Fees dated May 8, 2014 for International Application No. PCT/IB2013/060344, International Filing Date: Nov. 22, 2013 consisting of 8-pages.

First Office Action dated Dec. 31, 2014, in U.S. Appl. No. 13/788,587, filed Mar. 7, 2013 (24-pages).

International Search Report and Written Opinion dated Jul. 16, 2014 for International Application No. PCT/IB2013/060344, International Filing Date: Nov. 22, 2013 consisting of 21-pages.

Chun-Yun et al., "SAW Band Reject Filter Performance at 850 MHz" IEEE International Ultrasonics Symposium Proceedings, 2005, pp. 2162-2165.

Thomas Bauer et al., "Saw Band Rejection Filters for Mobile Digital Television", IEEE International Ultrasonics Symposium Proceedings, 2008, pp. 288-291.

* cited by examiner

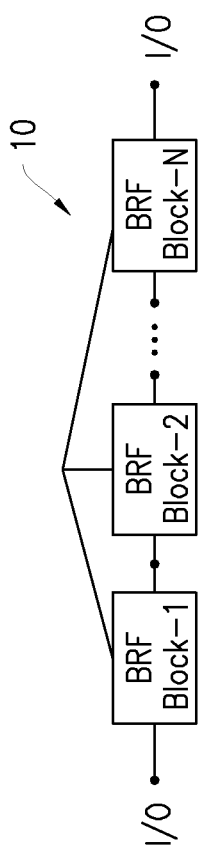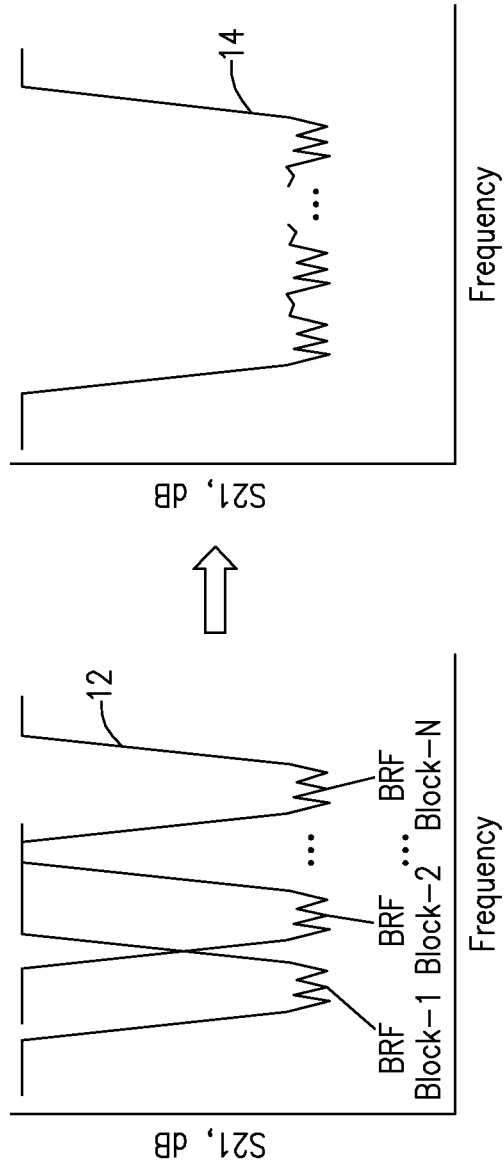
FIG. 1
FIG. 2
FIG. 3

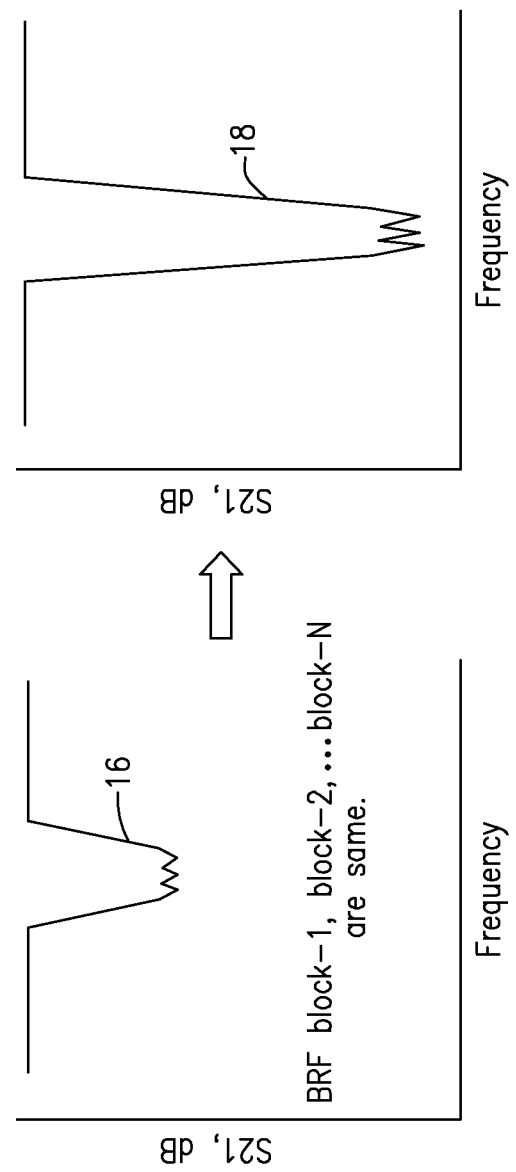

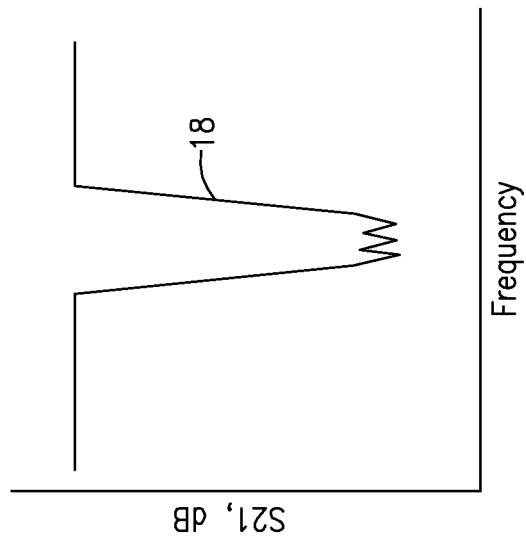
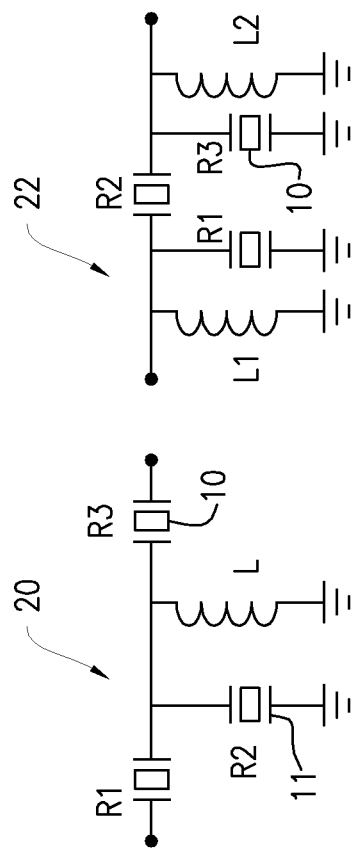
FIG. 6

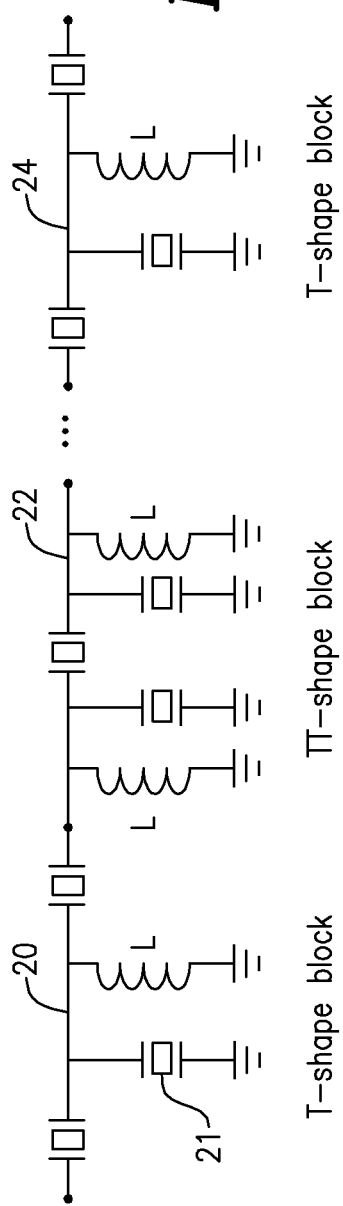
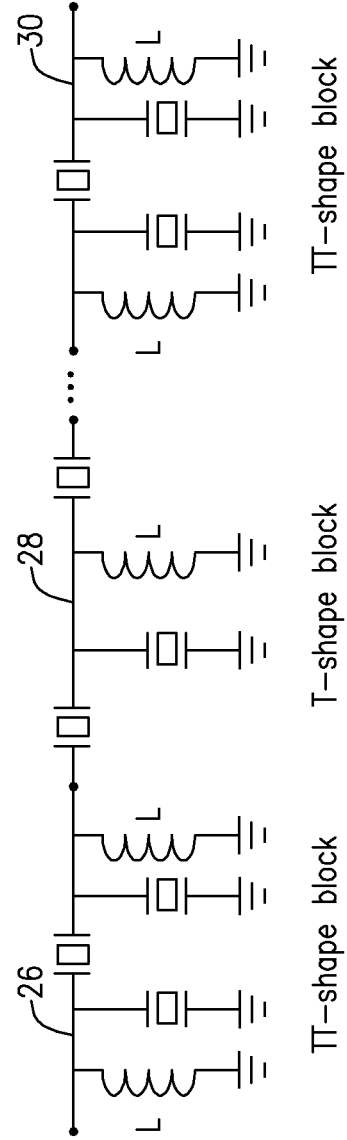

Side view

Top view

ACOUSTIC WAVE BAND REJECT FILTER

TECHNICAL FIELD

The present invention relates to filters, and in particular to acoustic wave band reject filters.

BACKGROUND

Band reject filters may be used in wireless network equipment, such as in base stations. Desirably, these band reject filters should be miniature in size to reduce the overall size of equipment in which they are installed. Surface acoustic wave (SAW) filters, bulk acoustic wave (BAW) filters and film bulk acoustic resonators (FBAR) have been used to implement miniature band pass filters, but have not been widely used in band reject filter implementations, primarily due to a lack of demand for such implementations in wireless network equipment that are based on first generation (1G) and second generation (2G) wireless communication standards.

However, with the emergence of implementations of third generation (3G) and fourth generation (4G) wireless communication standards, frequency spectrum allocation is constrained, requiring very closely spaced frequency channels. This means that filters in a radio frequency, RF, front end must have steep transition bands to avoid interference. Steep transitions can be achieved with band reject filters having high Q. However, when high Q band reject filters are implemented using conventional components, such filters are undesirably large in size and are relatively expensive.

Acoustic wave filters such as the SAW, BAW and FBAR, have been used to implement band pass filters, but not miniature band reject filters having steep transitions and deep stop bands.

SUMMARY

The present invention advantageously provides a method and system for providing an acoustic wave band reject filter. According to one aspect, an acoustic wave band reject filter includes a substrate that includes bonding pads formed on the substrate. A plurality of dies are positioned physically parallel to the substrate, each die having a side facing the substrate. The filter has a plurality of acoustic wave band reject filter blocks. At least one acoustic wave band reject filter block is fixed on a corresponding die. An acoustic wave band reject filter block is fixed on the side of the corresponding die facing the substrate. Solder balls are positioned to engage a corresponding bonding pad on the substrate. At least one of the bonding pads electrically connect adjacent dies via the solder balls. The plurality of acoustic wave band reject filter blocks collectively exhibit a band reject filter frequency response.

In one embodiment, each of the plurality of acoustic wave band reject filter blocks have adjacent, partially overlapping stop band frequency responses. An acoustic wave band reject filter block may be arranged as one of a series-parallel (T-type) electrical configuration and a parallel-series (pi-type) electrical configuration. An acoustic wave band reject filter block may be one of a surface acoustic wave filter, a bulk acoustic wave filter, and a film bulk acoustic resonator. In one embodiment the acoustic wave band reject filter further comprises an inductor external to the substrate, wherein at least one bonding pad electrically connects the external inductor to one of the plurality of dies without bonding wires. The external inductor may be electrically connected to a bonding pad positioned between dies. A die may have a width and a length, and the largest of the width and the length of a die may be less than 3 millimeters.

According to another aspect, the invention provides a method for constructing an acoustic wave band reject filter. The method includes forming bonding pads on a substrate and providing a plurality of dies, each die having a side that faces the substrate. Each die has a length and a width, a largest one of the length and width being less than about 3 millimeters to reduce thermal mismatch between a die and the substrate. The method includes forming solder balls on one of the substrate and each of the plurality of dies on the sides of the dies facing the substrate. An acoustic wave band reject filter block is formed on each one of the plurality of dies on the side of the die facing the substrate. The plurality of dies are positioned on the substrate such that the solder balls electrically connect bonding pads of the substrate.

In some embodiments, the acoustic wave band reject filter blocks are cascaded. The method may then further comprise providing bus bars on the substrate, the bus bars electrically connecting adjacent cascaded acoustic wave band reject filter blocks that, in some embodiments, have adjacent overlapping stop band frequency responses. Some embodiments further comprise providing an inductor external to the substrate, wherein at least one bonding pad electrically connects to the external inductor. The at least one bonding pad may electrically connect to the external inductor via a bonding wire. In one embodiment, the acoustic wave band reject filter blocks comprise two electrically series-parallel band reject filter blocks separated by an electrically parallel-series band reject filter block. In another embodiment, the acoustic wave band reject filter blocks comprise two electrically parallel-series band reject filter blocks separated by an electrically series-parallel band reject filter block.

According to another aspect, the invention provides an acoustic wave band reject filter. The acoustic wave band reject filter includes a substrate having bonding pads thereon. A first die and a second die each have a side that faces the substrate. A plurality of solder balls are positioned to electrically connect bonding pads of the substrate to positions on the first and second die. A first acoustic wave band reject filter circuit is formed on the first die. A second acoustic wave band reject filter circuit is formed on the second die. A first bus bar is formed on the substrate and configured to electrically connect the first acoustic wave band reject filter circuit to the second acoustic wave band reject filter circuit via the solder balls.

In some embodiments, the acoustic wave band reject filter further comprises a third die having a side facing the substrate. A plurality of solder balls are positioned to electrically connect bonding pads of the substrate to positions on the third die. A third acoustic wave band reject filter circuit is formed on the third die. A second bus bar is formed on the substrate and configured to electrically connect the second acoustic wave band reject filter circuit to the third acoustic wave band reject filter circuit via the solder balls. In one embodiment, the first die, the second die and the third die each have a corresponding width and a corresponding length, the largest one of the width and the length being less than 3 millimeters. In some embodiments, the first and second acoustic wave band reject filter circuits have adjacent overlapping stop band frequency responses. In another embodiment, the first acoustic wave band reject filter circuit and the second acoustic wave band reject filter circuit are electrically series-parallel band reject filters.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 1 is a block diagram of cascaded acoustic wave band reject filter blocks constructed in accordance with principles of the present invention;

FIG. 2 is graph of adjacent overlapping band stop regions of acoustic wave band reject filter blocks;

FIG. 3 is a graph of a resultant overall frequency response of cascaded acoustic wave band reject filter blocks having the responses shown in FIG. 2;

FIG. 4 is a graph of responses of individual acoustic wave band reject filter blocks having stop bands centered at the same frequency;

FIG. 5 is a graph of a resultant frequency response of cascaded acoustic wave band reject filter blocks having the individual responses shown in FIG. 4;

FIG. 6 is diagram of two acoustic wave band reject filter circuits and a resultant frequency response;

FIG. 7 is a circuit diagram of cascaded acoustic wave band reject filter blocks, each filter block having a T-type or pi-type configuration;

FIG. 8 is a circuit diagram of cascaded acoustic wave band reject filters blocks, each filter block having a pi-type or T-type configuration;

DETAILED DESCRIPTION OF THE INVENTION

Figure 9:
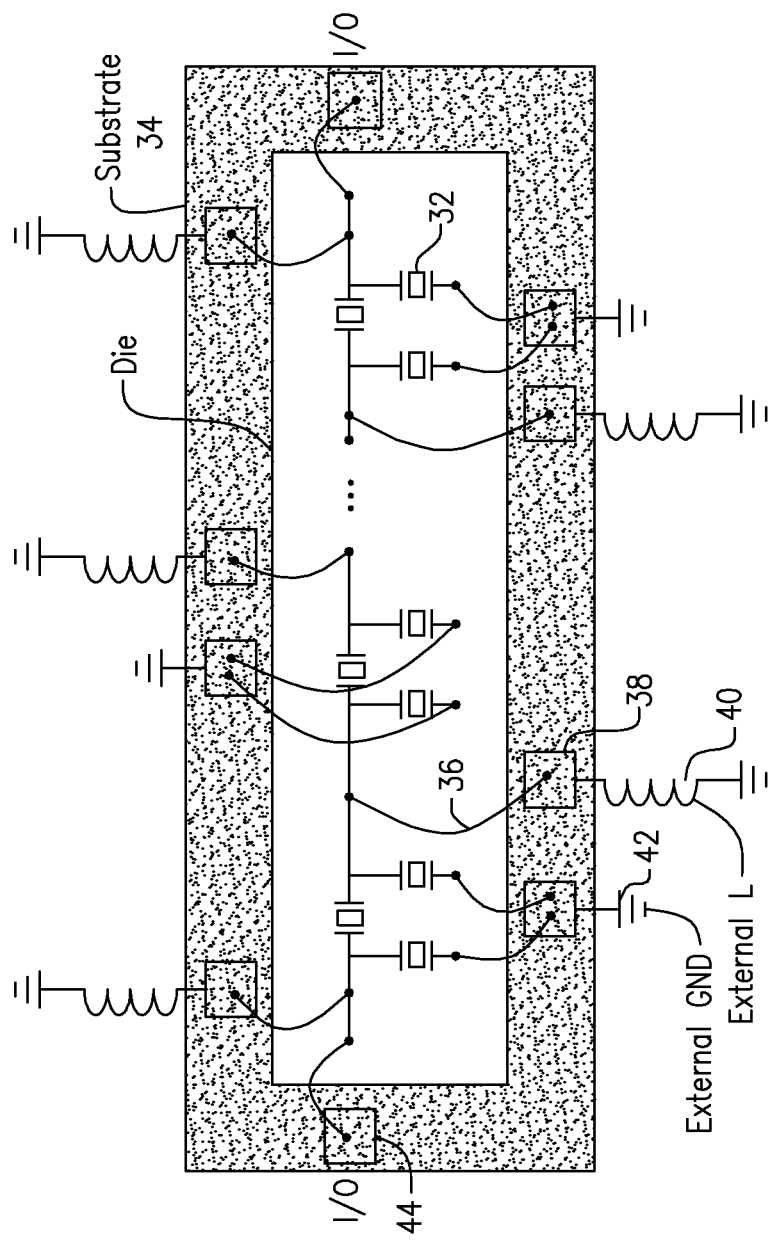
FIG. 9 is a circuit diagram of pi-type cascaded acoustic wave band reject filter blocks, having bonding wires electrically connecting external inductors, external ground, and input/output pads.

Before describing in detail exemplary embodiments that are in accordance with the present invention, it is noted that the embodiments reside primarily in combinations of apparatus components and processing steps related to providing an acoustic wave band reject filter. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring to the drawing figures, there is shown in FIG. 1 a block diagram of cascaded acoustic wave band reject filter blocks 10 constructed in accordance with principles of the present invention. The acoustic wave band reject filters are well-matched in their upper and lower pass bands. In one embodiment, each acoustic wave band reject filter block 10 has an acoustic wave band reject filter response 12, as shown in FIG. 2. FIG. 2 shows that the acoustic wave band reject filter responses of individual acoustic wave band reject filters may be adjacent and partially overlap. FIG. 3 is a graph of a resultant frequency response 14 of cascaded acoustic wave band reject filter blocks having the responses 12 shown in FIG. 2. The overall bandwidth of the stop band region of FIG. 3 depends on the number N of individual acoustic wave band reject filter blocks 10.

In another embodiment, each of the plurality of acoustic wave band reject filter blocks 10 of FIG. 1 has the approximate frequency response 16 shown in FIG. 4. FIG. 5 is a graph of a resultant approximate frequency response 18 of cascaded acoustic wave band reject filter blocks having the responses 16 shown in FIG. 4. The depth of the stop band region depends on the number N of individual acoustic wave band reject filter blocks 10.

Note that the filters of the embodiment of FIG. 2 and the embodiment of FIG. 4 can be combined to achieve a stop band that is as wide and as deep as desired. To achieve the desired response, a combination of SAW, BAW and FBAR types of acoustic wave filters may be employed.

FIG. 6 shows two resonator circuits 20 and 22 that may be implemented to form acoustic wave band reject filter blocks 10 to achieve a frequency response 18. The resonator circuits 20 and 22 have individual acoustic wave resonators 11. Resonator circuit 20 is a T-type configuration—series-parallel—and resonator circuit 22 is a pi-type configuration—parallel-series. The inductors of the resonator circuits 20 and 22 may be selected so that adjacent resonator circuits in a cascade of resonator circuits are well-matched. Well-matched resonator circuits may be cascaded to achieve a desired stop band region.

FIG. 7 is a circuit diagram of one embodiment of cascaded acoustic wave band reject filter blocks 20, 22, 24. Each acoustic wave band reject filter block includes two or more acoustic wave resonators 21. The width and depth of the frequency response of an acoustic wave band reject filter block may be influenced by adjusting static capacitances of the individual acoustic wave resonators 21, as well as by adjusting the inductors L.

In the embodiment of FIG. 7 a pi-type configuration 22 of an acoustic wave band reject filter is positioned between two T-type acoustic wave band reject filters 20 and 24. The inductors L may share the same value of inductance or may differ, and are used for matching adjacent filter blocks. FIG. 8 is a circuit diagram of another embodiment of cascaded acoustic wave band reject filter blocks 26, 28 and 30. In the embodiment of FIG. 8, a T-type configuration 28 (series-parallel) of an acoustic wave band reject filter is positioned between two pi-type (parallel-series) acoustic wave band reject filters 26 and 30. Other combinations of pi-type and T-type configurations may be implemented. Also, some embodiments may include T-type configurations only, or pi-type configurations only.

For example, FIG. 9 is a circuit diagram of pi-type configurations of cascaded acoustic wave band reject filter blocks 32 mounted on a substrate 34. Bonding wires 36 electrically connect terminals of the acoustic wave band reject filter blocks 32 to bonding pads 38. The bonding pads 38 are electrically connected to external inductors 40, external ground 42 and input/output, I/O, ports 44. The matching inductors 40 may be discrete components or may be implemented by short stubs formed on the substrate. Note that matching inductors between filter blocks may be combined into a single equivalent inductor or may be individually selected to achieve matching of adjacent acoustic wave band reject filter blocks. Note also that the substrate 34 can be part of a larger printed circuit board, PCB, or could be the substrate of a module or package. The package may provide a cover to protect the die upon which the filter blocks 32 are formed.

Using bonding wires 36 to electrically connect the filter blocks 32 to external components may become unsuitable if many bonding wires are needed, such as is the case with many acoustic wave band reject filter blocks. This is because the bonding wires produce parasitic inductances that degrade circuit performance, by causing, for example, mismatch between adjacent acoustic wave band reject filter blocks. Also, repeatability when using bonding wires is difficult to achieve, resulting in low product yield in the manufacturing process.

Figures 10, 11:
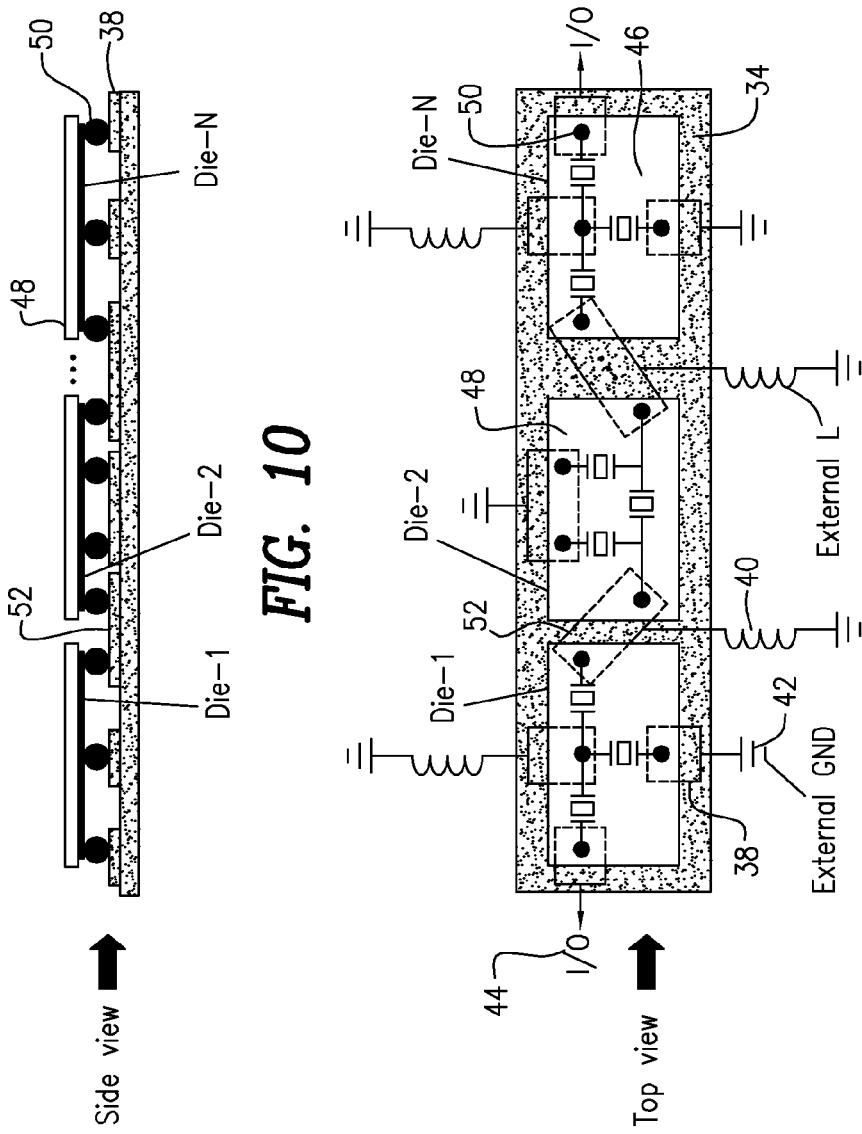
FIG. 10 is a side view of a circuit diagram of cascaded acoustic wave band reject filter blocks, having bonding pads electrically connecting external inductors, external ground, and input/output ports.
FIG. 11 is a top view of a circuit diagram of cascaded acoustic wave band reject filter blocks, having bonding pads electrically connecting external inductors, external ground, and input/output ports.

To eliminate the bonding wires and to utilize flip-chip technology—in which a die is positioned with the circuit facing the substrate—the configuration of FIGS. 10 and 11 can be employed. FIG. 10 is a side view and FIG. 11 is a corresponding top view of a circuit diagram of cascaded acoustic wave band reject filter blocks 46 having bonding pads 38 on the substrate 34 electrically connecting external inductors 40, external ground 42, and I/O ports 44. Each acoustic wave band reject filter block is formed on a separate die 48. Each die 48 is mounted on the substrate 34. Each separate die 48 has solder balls 50 on a side of the die 48 facing the substrate 34. A die 48 is positioned such that its solder balls 50 engage bonding pads 38 on the substrate 34. Note that the embodiment of FIG. 11 shows a pi-type configuration between two T-type configurations. In an alternative embodiment, the solder balls may be positioned on the substrate so as to engage positions on the die. Thus, in some embodiments, the solder balls are disposed upon the die after the resonator circuits are formed on the die, and in some embodiments, the solder balls are disposed on the substrate before the dies are positioned above the substrate.

Note that a difference between FIGS. 9 and 11 is that, in FIG. 9, all of the resonator circuits are formed on the same die, whereas in FIG. 11, each resonator circuit is formed on a different die. Thus, in different embodiments, one or more resonator circuits may be formed on a single die.

Figure 12:
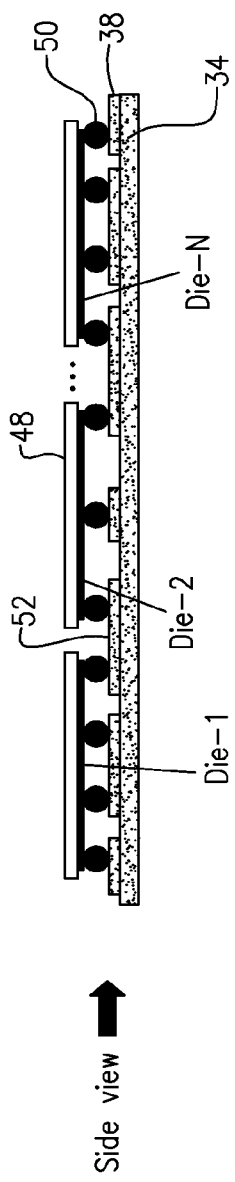
FIG. 12 is a side view of a circuit diagram of an alternative group of cascaded acoustic wave band reject filter blocks, having bonding pads electrically connecting external inductors, external ground, and input/output ports.
Figure 13:
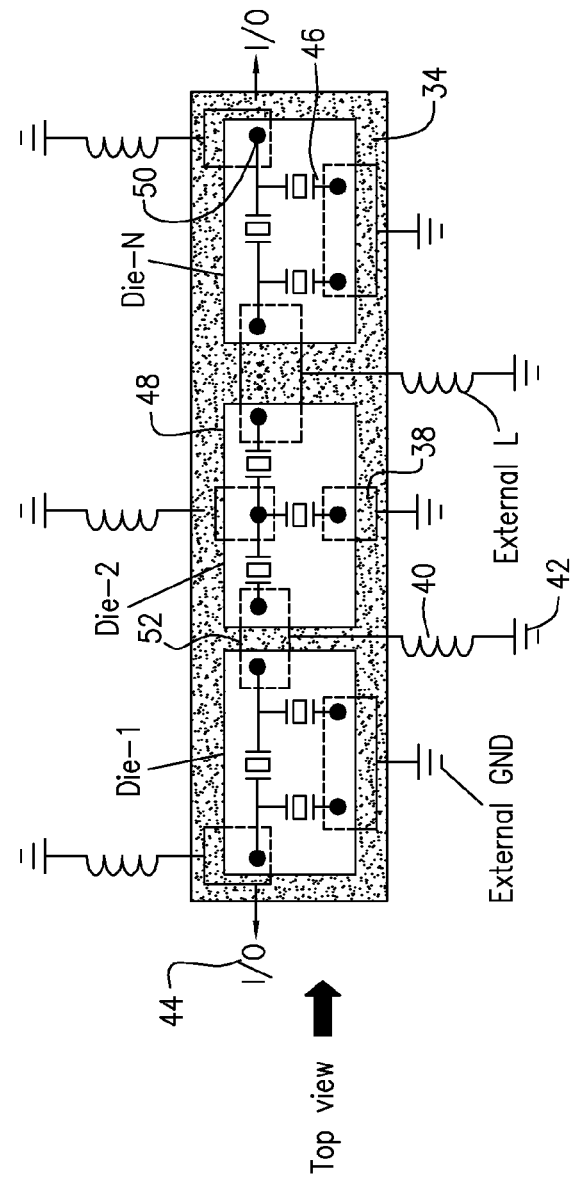
FIG. 13 is a top view of a circuit diagram of an alternative group of cascaded acoustic wave band reject filter blocks, having bonding pads electrically connecting external inductors, external ground, and input/output ports.

FIGS. 12 and 13 are similar to FIGS. 10 and 11, except that in FIG. 13, a T-type configuration is between two pi-type configurations. In the configuration of FIG. 11, electrode pads 52 that electrically connect adjacent acoustic wave band reject filter blocks are diagonal with respect to a main axis of the substrate 34, whereas FIG. 13 shows that the electrode pads 52 electrically connecting adjacent acoustic wave band reject filter blocks 46 are parallel to a main axis of the substrate 34. Note that although only three acoustic wave band reject filter blocks are shown in FIGS. 11 and 13, more or fewer acoustic wave band reject filter blocks may be implemented.

Note that one embodiment of the flip chip technology may be limited to dies of sizes having a largest dimension around 2.5-3.0 millimeters. This is because the die 48 is rigidly fixed on the substrate 34 by the solder balls 50, so that a larger die might produce a thermal mismatch and break the connections between the solder balls 50 and the bonding pads 38. Thus, in some embodiments, each acoustic wave band reject filter block is formed on a separate die, each separate die having a largest dimension less than about 3 millimeters.

Adjacent dies are electrically connected through the electrode pads 52 formed on the substrate 34. Since the electrode pads 52 formed on the substrate 34 have lower ohmic resistance than connecting bus bars formed on the die 48, the acoustic wave band reject filter may have lower insertion loss than known designs. Further, the solder balls 50 provide electrical connections with negligible parasitic resistance and inductance. In addition, the manufacture of the solder balls 50 is very stable, resulting in high product yield. Note also that the various die 48 need not be mounted in a straight line, as shown in FIGS. 10 and 11, but may be mounted in any suitable orientation, thereby providing greater design flexibility. Further, each acoustic wave band reject filter block 46 may be implemented with a SAW, BAW or FBAR device or any combination thereof.

Figure 14:
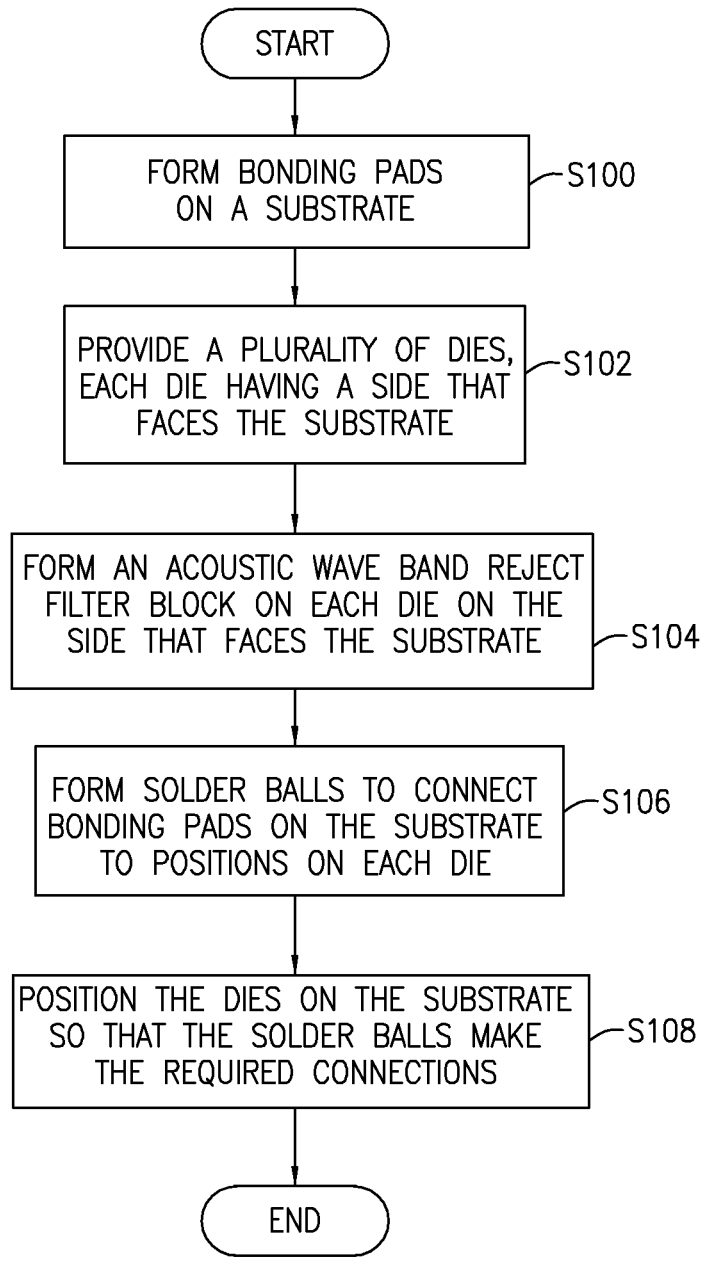
FIG. 14 is a flow chart of an exemplary process for constructing an acoustic wave band reject filter according to principles of the present invention.

FIG. 14 is a flow chart of an exemplary process for constructing an acoustic wave band reject filter. Bonding pads are formed on a substrate (block S100). A plurality of dies, each die having a side that faces the substrate, is provided (block S102). An acoustic wave band reject filter block is formed on each die on the side of the die that faces the substrate (block S104). Solder balls are formed to electrically connect bonding pads on the substrate to positions on each die (block S106). The dies are positioned above the substrate so that the solder balls make the required connections (block S108). In some embodiments, the process may further include providing bus bars on the substrate, where the bus bars electrically connect adjacent cascaded acoustic wave band reject filter blocks, and may further include providing an inductor external to the substrate in which at least one bonding pad electrically connects to the external inductor.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. An acoustic wave band reject filter, comprising:
   a substrate, the substrate including bonding pads formed on the substrate;
   a plurality of dies positioned physically parallel to the substrate, each die having a side facing the substrate;
   a plurality of acoustic wave band reject filter blocks, at least one of the plurality of acoustic wave band reject filter blocks being fixed on a corresponding die of the plurality of dies, the at least one acoustic wave band reject filter block being fixed on the side of the corresponding die facing the substrate, each of the plurality of acoustic wave band reject filter blocks having adjacent stop band frequency responses that substantially overlap only in transition regions;
   solder balls positioned to engage a corresponding bonding pad on the substrate, at least one of the bonding pads electrically connecting adjacent dies via the solder balls; and
   the plurality of acoustic wave band reject filter blocks collectively exhibiting a band reject filter frequency response.

2. The acoustic wave band reject filter of claim 1, wherein an acoustic wave band reject filter block of the plurality of acoustic wave band reject filter blocks is arranged as one of a series-parallel electrical configuration and a parallel-series electrical configuration.

3. The acoustic wave band reject filter of claim 1, wherein an acoustic wave band reject filter block of the plurality of acoustic wave band reject filter blocks is one of a surface acoustic wave filter, a bulk acoustic wave filter, and a film bulk acoustic resonator.

4. The acoustic wave band reject filter of claim 1, further comprising an inductor external to the substrate, wherein at least one bonding pad electrically connects the external inductor to one of the plurality of dies without bonding wires.

5. The acoustic wave band reject filter of claim 4, wherein the external inductor is electrically connected to a bonding pad positioned between dies.

6. The acoustic wave band reject filter of claim 1, wherein each of the dies have a width and a length, and the largest of the width and the length of a die is less than 3 millimeters.

7. A method for constructing an acoustic wave band reject filter, the method comprising:
   forming bonding pads on a substrate;
   providing a plurality of dies, each die having a side that faces the substrate, each die having a length and a width, a largest one of the length and width being less than about 3 millimeters to reduce thermal mismatch between each of the dies and the substrate;
   forming solder balls on one of the substrate and each of the plurality of dies on the sides of the dies facing the substrate;
   mounting an acoustic wave band reject filter block on each one of the plurality of dies on the side of the die facing the substrate, the acoustic wave band reject filter blocks having adjacent stop band frequency responses that substantially overlap only in transition regions; and
   positioning the plurality of dies on the substrate such that the solder balls electrically connect bonding pads of the substrate, at least one of the bonding pads electrically connecting adjacent dies via the solder balls.

8. The method of claim 7, wherein the acoustic wave band reject filter blocks are cascaded.

9. The method of claim 8, further comprising providing bus bars on the substrate, the bus bars electrically connecting adjacent cascaded acoustic wave band reject filter blocks.

10. The method of claim 7, further comprising providing an inductor external to the substrate, wherein at least one bonding pad electrically connects to the external inductor.

11. The method of claim 10, wherein the at least one bonding pad electrically connects to the external inductor via a bonding wire.

12. The method of claim 7, wherein the acoustic wave band reject filter blocks comprise two electrically series-parallel band reject filter blocks separated by an electrically parallel-series band reject filter block.

13. The method of claim 7, wherein the acoustic wave band reject filter blocks comprise two electrically parallel-series band reject filter blocks separated by an electrically series-parallel band reject filter block.

14. An acoustic wave band reject filter, comprising:
   a substrate having bonding pads thereon;
   a first die and a second die, each of the first die and the second die having a side that faces the substrate;
   a plurality of solder balls, the solder balls positioned to electrically connect bonding pads of the substrate to positions on the first and second die;
   a first acoustic wave band reject filter circuit formed on the first die;
   a second acoustic wave band reject filter circuit formed on the second die, the first and second acoustic wave band reject filter circuits having adjacent stop band frequency responses that substantially overlap only in transition regions; and
   a first bus bar formed on the substrate and configured to electrically connect the first acoustic wave band reject filter circuit to the second acoustic wave band reject filter circuit via the solder balls.

15. The acoustic wave band reject filter of claim 14, further comprising:
   a third die having a side facing the substrate;
   a plurality of solder balls positioned to electrically connect bonding pads of the substrate to positions on the third die;
   a third acoustic wave band reject filter circuit formed on the third die; and
   a second bus bar formed on the substrate and configured to electrically connect the second acoustic wave band reject filter circuit to the third acoustic wave band reject filter circuit via the solder balls.

16. The acoustic wave band reject filter of claim 15, wherein the first die, the second die and the third die each have a corresponding width and a corresponding length, the largest one of the width and the length being less than 3 millimeters.

17. The acoustic wave band reject filter of claim 14, wherein the first acoustic wave band reject filter circuit and the second acoustic wave band reject filter circuit are electrically series-parallel band reject filters.

* * * * *